United States Patent

Oka et al.

[11] Patent Number: 5,906,469
[45] Date of Patent: May 25, 1999

[54] APPARATUS AND METHOD FOR DETECTING AND CONVEYING SUBSTRATES IN CASSETTE

[75] Inventors: Yoshiji Oka; Yoshiteru Fukutomi; Masayuki Itaba; Yasufumi Koyama; Toshiya Yuge, all of Kyoto, Japan

[73] Assignee: Dainippon Screen Mfg. Co., Ltd., Japan

[21] Appl. No.: 08/752,149

[22] Filed: Nov. 18, 1996

[30] Foreign Application Priority Data

Nov. 22, 1995 [JP] Japan ................................ 7-328376
Nov. 22, 1995 [JP] Japan ................................ 7-328377

[51] Int. Cl.⁶ ................................................ B65G 49/07
[52] U.S. Cl. ........................ 414/416; 414/937; 414/811
[58] Field of Search .................................. 414/416, 811, 414/936, 937, 941; 901/2

[56] References Cited

U.S. PATENT DOCUMENTS

| | | | |
|---|---|---|---|
| 4,770,590 | 9/1988 | Hugues et al. | 414/937 X |
| 4,803,373 | 2/1989 | Imamura et al. | 414/937 X |
| 5,044,752 | 9/1991 | Thurfjell et al. | 414/937 X |
| 5,239,182 | 8/1993 | Tateyama et al. | 414/937 X |
| 5,277,539 | 1/1994 | Matsui et al. | 414/416 X |
| 5,409,348 | 4/1995 | Suzuki | 414/937 X |
| 5,540,098 | 7/1996 | Ohsawa | 414/937 X |
| 5,563,798 | 10/1996 | Berken et al. | 414/935 X |
| 5,645,391 | 7/1997 | Ohsawa et al. | 414/937 X |

FOREIGN PATENT DOCUMENTS

| | | | |
|---|---|---|---|
| 4238834 | 5/1993 | Germany | 414/941 |
| 3050035 | 3/1988 | Japan | 414/937 |
| 3122235 | 5/1988 | Japan | 414/937 |
| 3129642 | 6/1988 | Japan | 414/937 |
| 3131533 | 6/1988 | Japan | 414/937 |
| 3-297156 | 12/1991 | Japan . | |
| 4192346 | 7/1992 | Japan | 414/937 |
| 4-321253 | 11/1992 | Japan . | |
| 5036812 | 2/1993 | Japan | 414/937 |

*Primary Examiner*—James W. Keenan
*Attorney, Agent, or Firm*—Ostrolenk, Feber, Gerb & Soffen, LLP

[57] ABSTRACT

A substrate detecting apparatus includes: a light sensor unit having a light-emission element and a light-receiving element arranged to face each other across the cassette, and a vertical driving device for moving at least one of the light sensor unit and the cassette relative to each other in a vertical direction a substrate position detector is also provided for detecting a vertical positional range of each substrate held in the cassette, based on a wave form of an output signal generated by the light sensor unit as the at least one of the light sensor unit and the cassette is vertically moving relative to each other. A substrate conveying apparatus includes a clearance measurement device for measuring a vertical clearance between a pair of substrates held in the cassette, and an arm driving device for inserting the conveyance arm between the pair of substrates while lifting up the conveyance arm along a slant locus when the vertical clearance is less than a predetermined critical value.

21 Claims, 10 Drawing Sheets

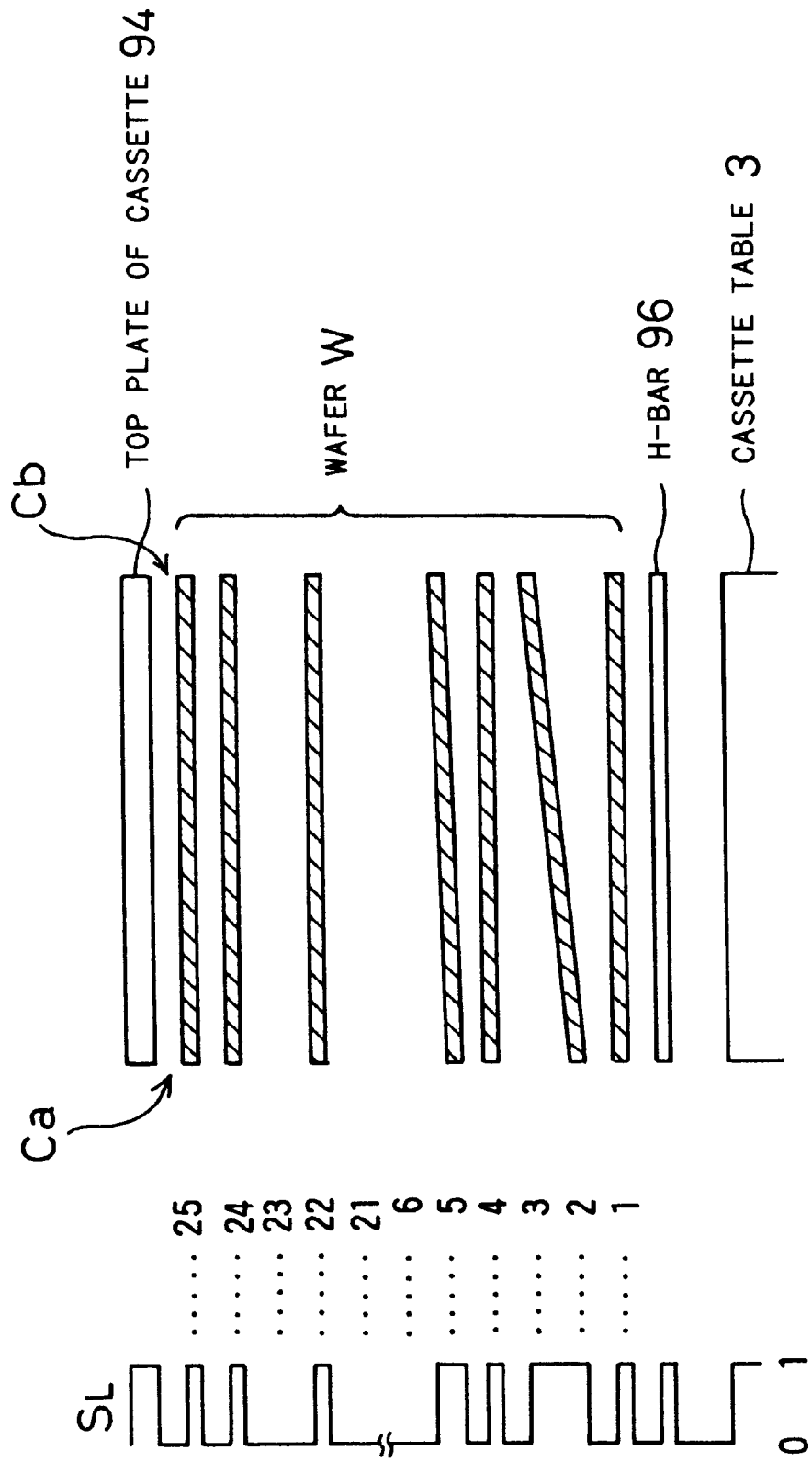

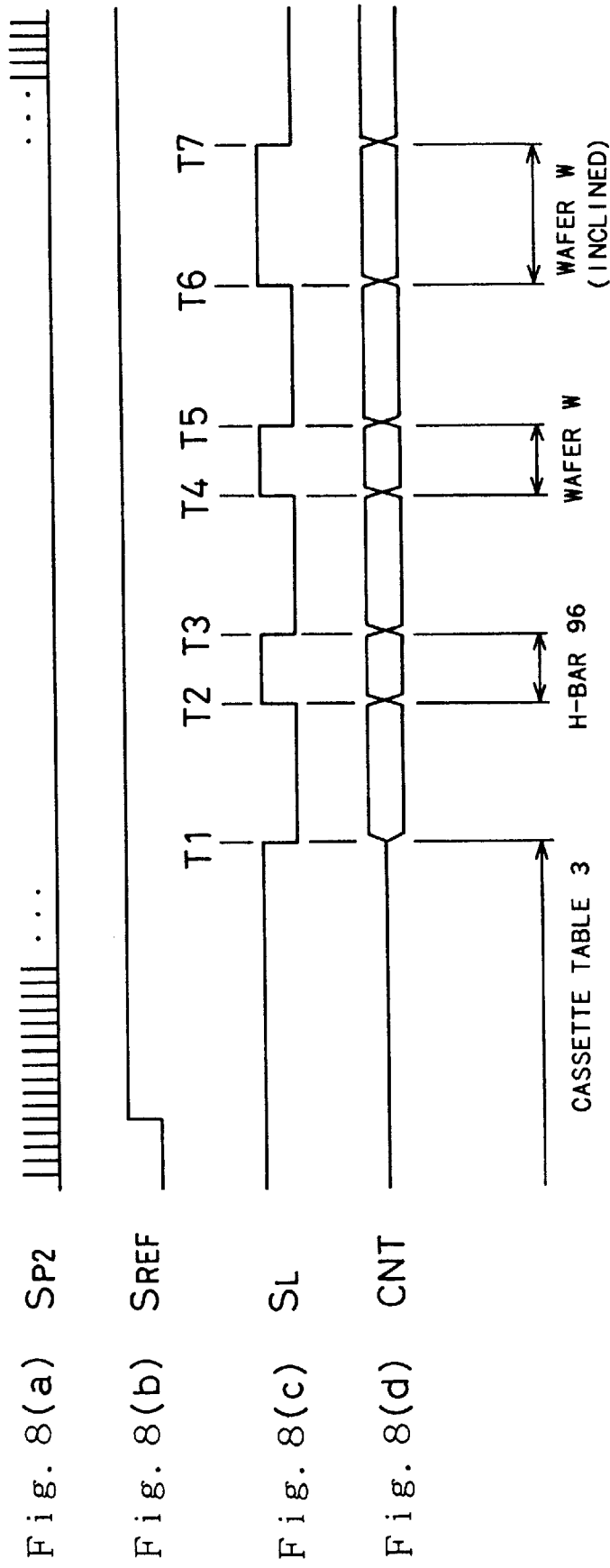

APPARATUS AND METHOD FOR DETECTING AND CONVEYING SUBSTRATES IN CASSETTE

BACKGROUND OF THE INVENTION

1. Field of the Invention

The present invention relates to detection of substrates, such as semiconductor wafers, within a cassette, and conveyance of the substrates from and into the cassette.

2. Description of the Related Art

In a substrate processing apparatus, such as a semiconductor wafer processing apparatus, each wafer held in a cassette is taken out from the cassette with a conveyance arm. According to conventional technique, the positions of the substrates within the cassette are first detected, and then the conveyance arm is horizontally inserted between the substrates.

A conventional apparatus for detecting substrates within a cassette checks whether a light receiving element of a light sensor is in a light-receiving state or in a non-light receiving state at each predetermined position in a cassette, thereby determining whether or not a substrate exists at each predetermined position.

The cassettes have grooves for receiving substrates. The grooves typically give a rise to their rear portions. Further, the cassettes themselves may be distorted. Thus, the substrates within such a cassette are slightly inclined forward in many cases.

In some cases, a clearance between two substrates within a cassette becomes less than a thickness of a conveyance arm. If the conveyance arm were horizontally inserted between the two substrates, the arm would interfere with the two substrates.

In order to allow the conveyance arm to be inserted into a cassette without interfering with any substrate in the cassette, it is accordingly desirable to detect a vertical positional range of each substrate, in addition to the information showing whether or not a substrates exists at each predetermined position. The prior art detection apparatus, however, can not detect the vertical positional range of each substrate within the cassette.

SUMMARY OF THE INVENTION

Accordingly, an object of the present invention is to reduce the possibility of interference between a conveyance arm and substrates within a cassette.

Another object of the present invention is to detect a vertical positional range of each substrate within a cassette.

The above objects are attained at least partly by an apparatus according to the present invention for detecting substrates held in a cassette. The apparatus comprises: a light sensor unit comprising a light-emission element and a light-receiving element arranged to face each other across the cassette; vertical driving means for moving at least one of the light sensor unit and the cassette relative to each other in a vertical direction; and substrate position detecting means for detecting a vertical positional range of each substrate held in the cassette, based on a wave form of an output signal generated by the light sensor unit as the at least one of the light sensor unit and the cassette is vertically moving relative to each other.

A light beam of the light sensor unit is cut off by a substrate within a cassette, and the light sensor unit comes into a non-light receiving state. Accordingly, a vertical positional range of each substrate held in the cassette can be detected based on a wave form of the output signal generated by the light sensor as the light sensor unit and/or the cassette are vertically moved relative to each other.

In a preferred embodiment, the cassette comprises a first opening through which each substrate is inserted and taken out and a second opening arranged opposite to the first opening; and wherein the light-emission element and the light-receiving element are arranged so that a light beam emitted from the light-emission element is to pass through the first opening and the second opening to be received by the light-receiving element. This embodiment determines a vertical positional range of each substrate, where the vertical positional range is a projection of the substrate substantially along a direction of insertion of a conveyance arm (that is, the direction from the first opening and the second opening).

Preferably, the light-emission element and the light-receiving element are substantially horizontally arranged.

The substrate position detecting means comprises position determining means for determining a range of an output level of the light sensor unit that represents a non-light receiving state of the light-receiving element as the vertical positional range of each substrate.

The substrate position detecting means comprises: positional pulse signal generating means for generating one pulse of a positional pulse signal each time when the at least one of the light sensor unit and the cassette vertically moves by a predetermined distance relative to each other; a counter for counting the number of pulses of the positional pulse signal; storage means for successively storing the count on the counter at a timing when the light sensor unit switches its output level; and position determining means for determining the vertical positional range of each substrate held in the cassette, based on the count stored in the storage means.

The present invention is also directed to an apparatus for conveying a substrate from and into a cassette with a conveyance arm. The apparatus comprises: clearance measurement means for measuring a vertical clearance between a pair of substrates held in the cassette; and arm driving means for inserting the conveyance arm between the pair of substrates while lifting up the conveyance arm along a slant locus when the vertical clearance is less than a predetermined critical value.

When the vertical clearance is less than a predetermined critical value, the possibility of interference between the conveyance arm and a substrate is considerably high if the conveyance arm is horizontally inserted between a pair of substrates. In such a case, the possibility would be reduced by inserting the conveyance arm between the pair of substrates while lifting up the conveyance arm along a slant locus.

In a preferred embodiment, the arm driving means comprises means for adjusting a vertical width of the slant locus according to the vertical clearance. The possibility of interference between the conveyance arm and a substrate can be reduced by increasing the vertical width of the slant locus as the vertical clearance decreases.

The arm driving means horizontally inserts the conveyance arm between the pair of substrates when the vertical clearance is more than the predetermined critical value. In this case, the possibility of interference between the conveyance arm and a substrate is low even if the arm is inserted horizontally.

The apparatus may further comprise means for stopping the insertion of the conveyance arm and raising an alarm if the vertical clearance is less than a predetermined limit value. This would prevent the interference between the conveyance arm and a substrate.

The clearance measurement means comprises clearance storing means for storing the vertical clearance; and wherein the arm driving means drives the conveyance arm when returning a substrate which was taken out from the cassette so that the conveyance arm is inserted into the cassette along the slant locus. Thus, the interference between the conveyance arm and a substrate will be prevented when returning a substrate into the cassette.

The present invention is further directed to a method of detecting substrates held in a cassette. The method comprises the steps of: moving at least one of a light sensor unit and a cassette relative to each other in a vertical direction, the light sensor unit comprising a light-emission element and a light-receiving element arranged to face each other across the cassette; and detecting a vertical positional range of each substrate held in the cassette, based on a wave form of an output signal generated by the light sensor unit as the at least one of the light sensor unit and the cassette is vertically moving relative to each other.

The present invention is also directed to a method of conveying a substrate from and into a cassette with a conveyance arm. The method comprises the steps of: measuring a vertical clearance between a pair of substrates held in the cassette; and inserting the conveyance arm between the pair of substrates while lifting up the conveyance arm along a slant locus when the vertical clearance is less than a predetermined critical value.

These and other objects, features, aspects, and advantages of the present invention will become more apparent from the following detailed description of the preferred embodiments with the accompanying drawings.

BRIEF DESCRIPTION OF THE DRAWINGS

FIGS. 7A and 7B show a wave form of a light-receiving signal SL generated by a light receiving element 23 when a light sensor 24 moves in the vertical direction;

FIGS. 8 (a)–8 (d) are timing charts showing operation of a substrate position detector 40;

DESCRIPTION OF THE PREFERRED EMBODIMENT

Figure 1:
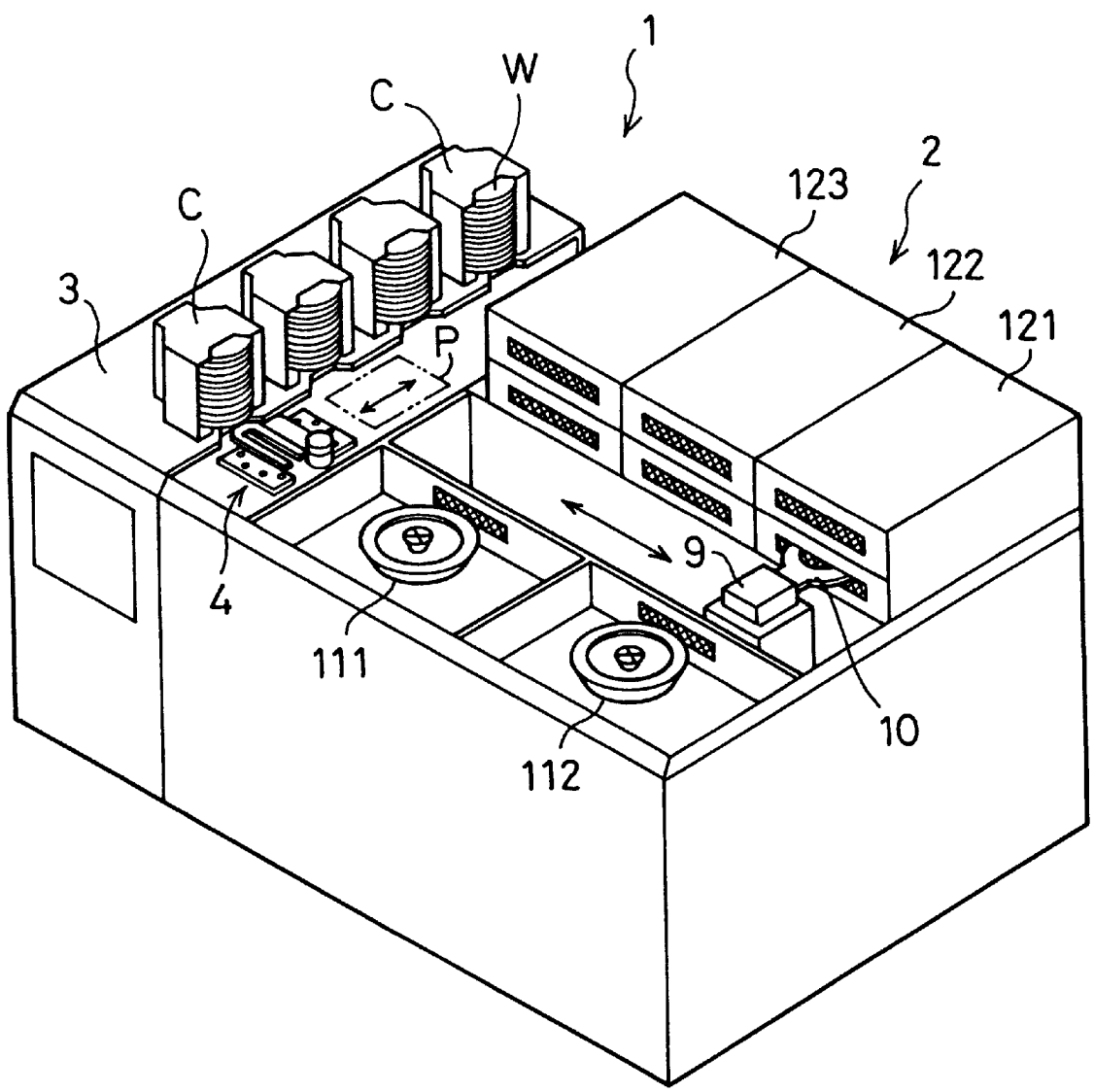
FIG. 1 is a perspective view illustrating a semiconductor wafer processing system with an apparatus for detecting substrates embodying the present invention.

A. Structure of Apparatus:

FIG. 1 is a perspective view illustrating a semiconductor wafer processing system comprising an apparatus for detecting substrates in a cassette embodying the present invention.

The semiconductor wafer processing system is used to thermally treat substrates, such as semiconductor wafers. The system includes an indexer unit (substrate loading and unloading unit) 1 for taking wafers W into and out of a plurality of cassettes C, and a group of processing units 2 for successively processing the wafers W taken out of the cassettes C. The indexer unit 1 includes a cassette table 3 on which the cassettes C are mounted, and a substrate loading and unloading mechanism 4 for taking the wafers W into and out of the cassettes C. The group of processing units 2 include rotary processing units 111 and 112, heat treatment units 121 through 123, and a substrate conveyance mechanism 9 for transporting the wafers W to these processing units.

Figure 2:
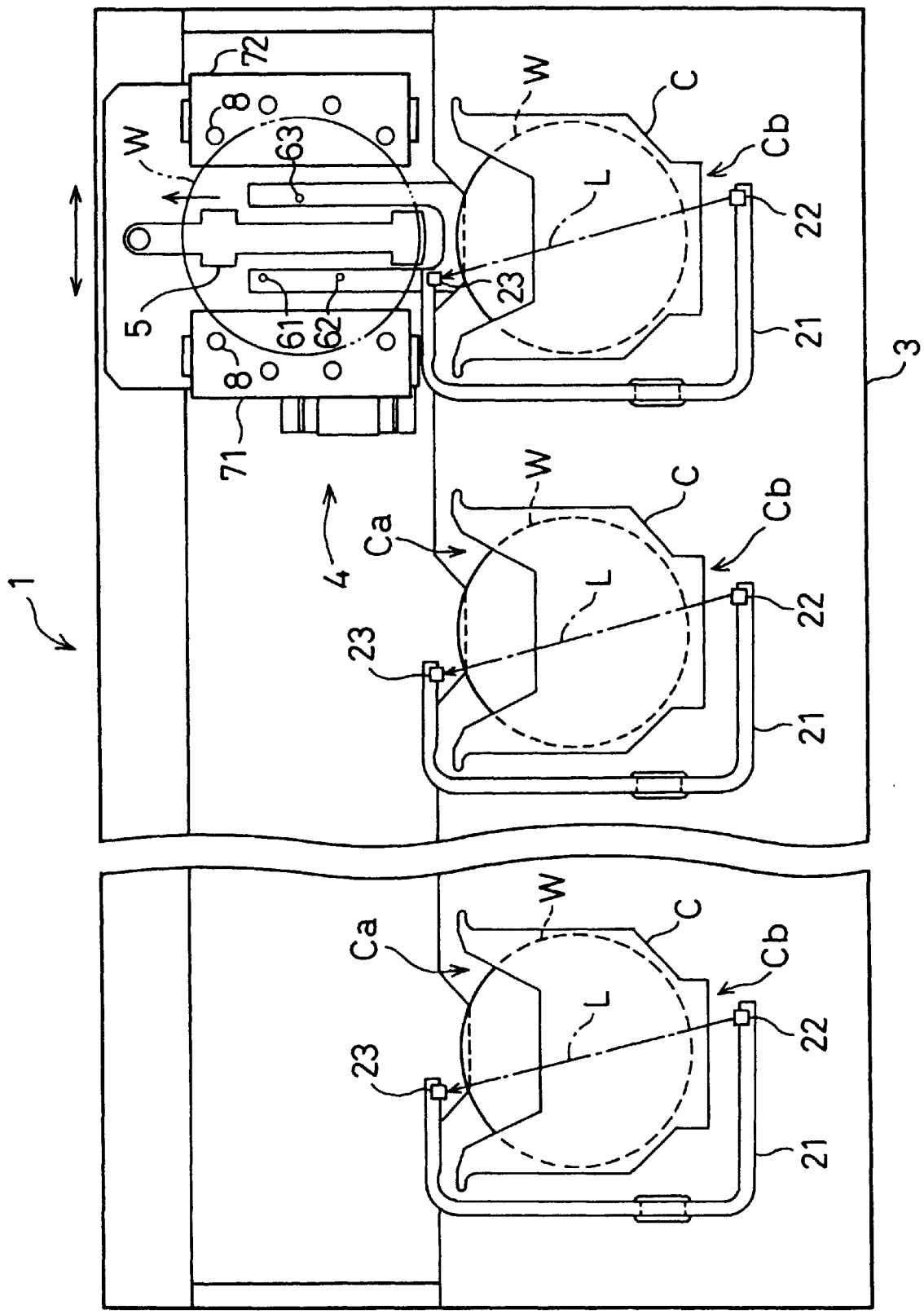
FIG. 2 is a plan view illustrating an indexer unit 1 shown in FIG. 1.

FIG. 2 is a plan view illustrating the indexer unit 1. A plurality of cassettes C for receiving the wafers W in a multi-step manner are mounted on the cassette table 3 of the indexer unit 1. An essential part of the apparatus for detecting substrates (described later) is arranged under the cassette table 3.

The substrate loading and unloading mechanism 4 has a substrate conveyance arm 5 that moves up and down along a vertical axis thereof, and forward and backward along a longitudinal axis thereof. The substrate conveyance arm 5 takes out wafers W, which are held in grooves formed in each cassette C, and carries wafers W into the grooves of each cassette C. The substrate loading and unloading mechanism 4 is further provided with three vertically movable support pins 61, 62 and 63 for supporting a wafer W taken out by the substrate conveyance arm 5, and positioning plates 71 and 72 for positioning the center of the wafer W supported by the support pins 61, 62 and 63. A plurality of protrusions 8 are formed on the positioning plates 71 and 72 and arranged to have a substantially identical curvature with the outer diameter of the wafer W. Horizontal reciprocating movements of the positioning plates 71 and 72 enable the protrusions 8 to be in contact with and apart from the periphery of the wafer W, so as to position the center of the wafer W.

Each wafer W taken out of the cassette C by the substrate loading and unloading mechanism 4 is shifted to a substrate transfer position (position P in FIG. 1) and transferred to the substrate conveyance mechanism 9 for conveyance to the group of processing units 2 (see FIG. 1).

Referring to FIG. 1, the substrate conveyance mechanism 9 has a pair of substantially U-shaped substrate support arms 10 for supporting a wafer W. The substrate conveyance mechanism 9 successively replaces a non-processed wafer W with a processed wafer W in each unit of the group of processing units 2 and transports the processed wafer W to a subsequent unit according to a preset recipe of processing, or data defining a procedure for the processing. After being processed by the group of processing units 2, the wafer W is transferred from the substrate conveyance mechanism 9 to the substrate loading and unloading mechanism 4 at the substrate transfer position P and returned into the cassette C by the substrate loading and unloading mechanism 4.

Figure 3:
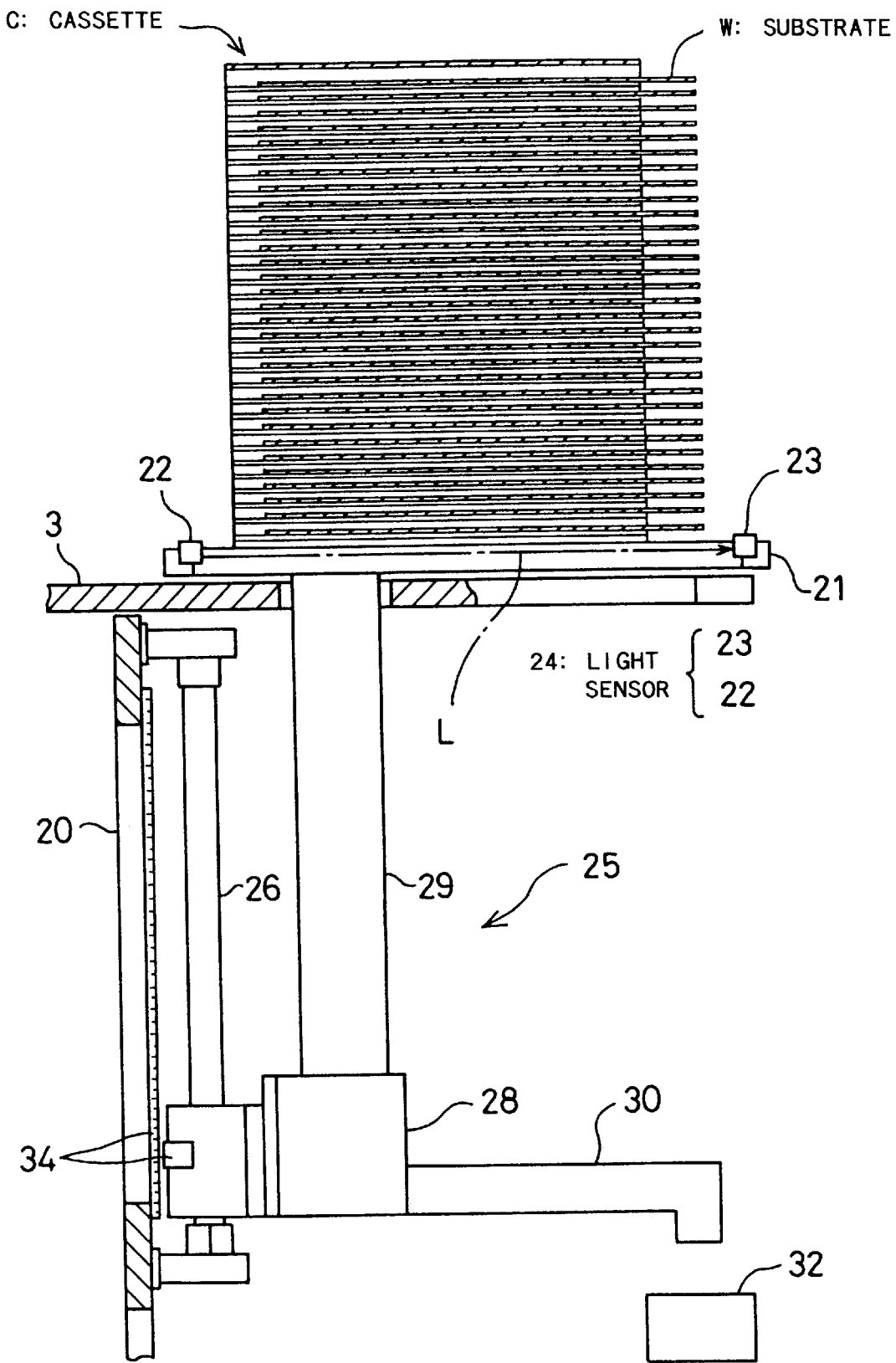
FIG. 3 is a partly broken front view illustrating a mechanical structure of the apparatus for detecting the substrates.

FIG. 3 is a partly broken front view illustrating a mechanical structure of the apparatus for detecting substrates in a cassette. The apparatus comprises brackets 21, each of which lifts up and down i.e., vertically moves around each cassette C mounted on the cassette table 3. Referring to FIG. 2, each bracket 21 has a substantially U shape and is arranged to surround each cassette C. A light sensor 24 comprising a light emission element 22 and a light receiving element 23, which are each attached to one end of bracket 21 for detecting a wafer W within the cassette C. The light receiving element 23 is arranged in front of a substrate insertion opening Ca, which is formed on a front face of each cassette C. The light emission element 22 is arranged behind another opening Cb which is formed opposite to the substrate insertion opening Ca. The light emission element 22 and the light receiving element 23 are disposed so that their optical axis is substantially horizontal and parallel to the substrate conveyance arm 10. A light beam L emitted from the light emission element 22 enters the cassette C via the rear-end opening Cb, passes through the substrate insertion opening Ca, and is received by the light receiving element 23. In the case where a wafer W is present in the cassette C, the light beam L is cut off by the wafer W. The position of the light emission element 22 and the light receiving element 23 is determined to enable the light beam L to pass through the two openings Ca and Cb formed in front of and behind the cassette C if a wafer is not present. This structure enables the wafer W received in the cassette C to cut-off the light beam L. A vertical range in which the light beam L is cut off by the wafer W corresponds to a range to which the wafer W is positioned along the direction of insertion of the substrate conveyance arm 5, i.e., the direction from the substrate insertion opening Ca to the opening Cb. The light emission element 22 and the light receiving element 23 may be positioned inversely.

Referring to FIG. 3, a lifting mechanism 25 for lifting each bracket 21 up and down is disposed below the cassette table 3. The lifting mechanism 25 includes a rod-less cylinder 26 supported by and vertically arranged parallel to a support plate 20, and a movable member 28 slidably fitted to the rod-less cylinder 26. A vertical member 29 capable of extending through the cassette table 3 is disposed above the movable member 28 and linked with the bracket 21. A light shielding plate 30 is attached to a side face of the movable member 28, and a timing sensor 32 including a photo interrupter is disposed below the light shielding plate 30. In a stand-by state, the light shielding plate 30 is inserted in a clearance of the timing sensor 32, which thereby keeps the timing sensor 32 in a non-light receiving state. When the lifting mechanism 25 starts operation and the light shielding plate 30 changes the timing sensor 32 to a light-receiving state, the timing sensor 32 outputs a signal indicating that the bracket 21, or the light sensor 24 is present at a starting position. The movable member 28 is further provided with a linear scale sensor 34 for outputting a positional pulse signal representing a vertical position of the light sensor 24. A variety of encoders and other means may be used, instead of the linear scale sensor, for outputting a signal representing a vertical position of the light sensor 24.

A driving mechanism (not shown) of the rod-less cylinder 26 supplies the air from upper and lower ends of the rod-less cylinder 26, and a magnet (not shown) in the rod-less cylinder 26 then moves up and down. This leads to a vertical movement of the movable member 28 and lifts the light sensor 24 attached to the bracket 21 up and down along the periphery of the cassette C. The linear scale sensor 34 generates one pulse of positional pulse signal every time the movable member 28 moves up or down by a predetermined distance.

The lifting mechanism 25 is not restricted to the rod-less cylinder 26 described above, but it may be a conventional air cylinder or a screw-based feeding mechanism with a motor.

Figure 4:
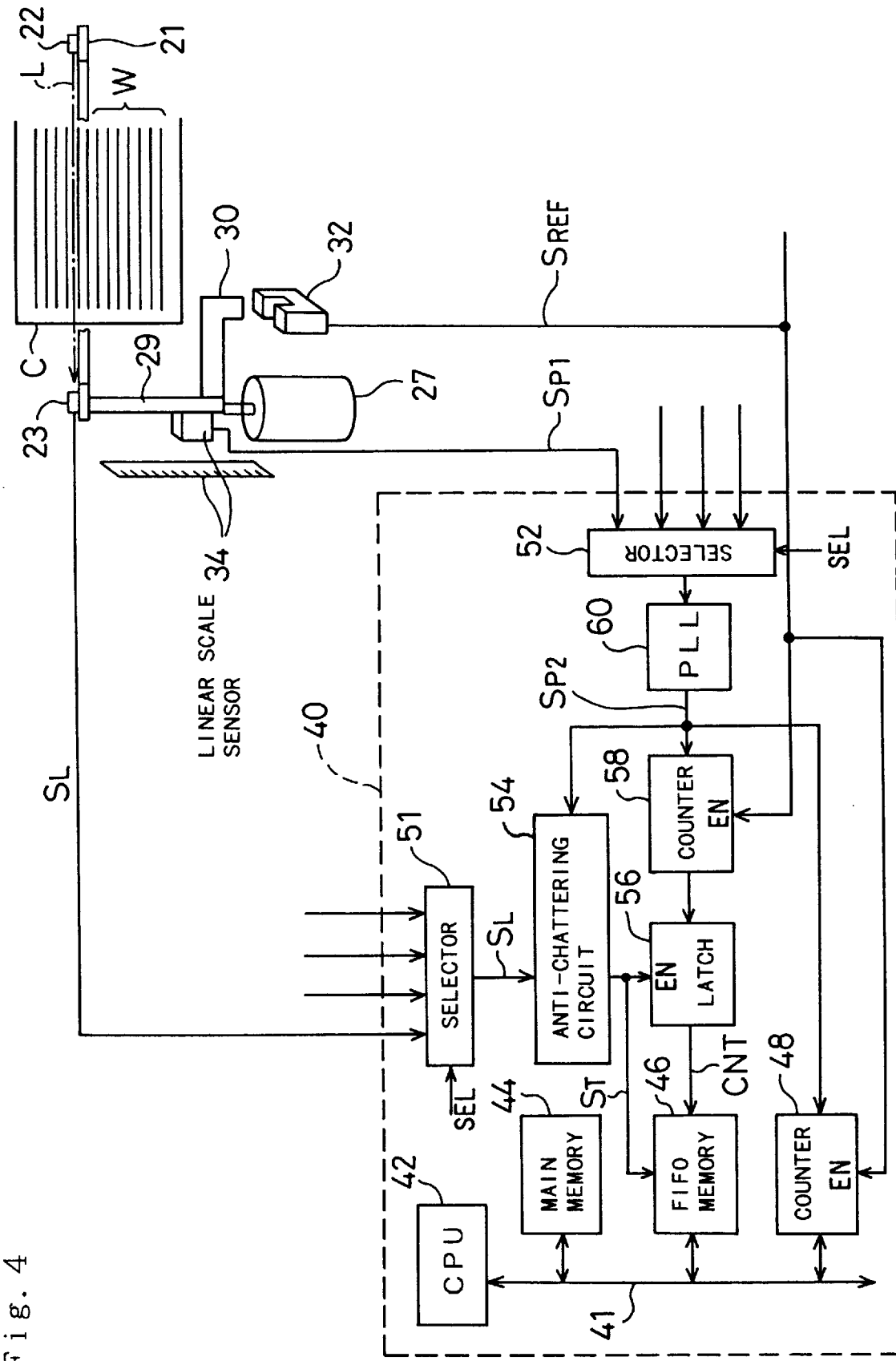
FIG. 4 shows an electrical structure of the apparatus for detecting the substrates.

FIG. 4 conceptually shows an electrical structure of the apparatus for detecting substrates in a cassette. The light receiving element 23 generates a light-receiving signal SL indicating whether or not the light receiving element 23 receives a light beam L. The timing sensor 32 outputs a starting position signal SREF indicating that the bracket 21 is present at the starting position. The linear scale sensor 34 generates a positional pulse signal SP1 indicating a moving distance of the light sensor 24. These signals SL, SP1, and SREF are inputted into a substrate position detector 40.

The substrate position detector 40 comprises a CPU 42, a main memory 44, an FIFO memory 46, and a first up-down counter 48, which are all connected to a bus 41. The substrate position detector 40 further includes two selectors 51 and 52, an anti-chattering circuit 54, a latch 56, a second up-down counter 58, and a PLL circuit 60.

The first selector 51 receives the light-receiving signal SL output from each light receiving element 23 for each cassette C mounted on the cassette table 3. In the embodiment of FIG. 1, four cassettes C are mounted on the cassette table 3, and four light-receiving signals SL are input into the first selector 51. The second selector 52 receives the positional pulse signal SP1 output from each linear scale sensor 34 for each cassette C. The two selectors 51 and 52 select one of the four signals in response to a selection signal SEL supplied from the CPU 42.

The positional pulse signal SP1 selected by the second selector 52 is input into the PLL circuit 60 and converted to a second positional pulse signal SP2 having a frequency that is an integral multiple of the frequency of the original positional pulse signal SP1. By way of example, the PLL circuit 60 quadruples the frequency of the original positional pulse signal SP1 that generates one pulse at every 0.1 mm, so as to yield the second positional pulse signal SP2 that generates one pulse at every 0.025 mm. The function of the PLL circuit 60 can make the resolution (or a distance corresponding to one pulse) of the second positional pulse signal SP2 sufficiently small. If the original positional pulse signal SP1 has a sufficiently small resolution, the PLL circuit 60 may be omitted. The linear scale sensor 34 and the PLL circuit 60 correspond to the positional pulse signal generating means of the present invention.

The second positional pulse signal SP2 generated by the PLL circuit 60 is transmitted to the two up-down counters 48 and 58 and the anti-chattering circuit 54. The positional pulse signals SP1 and SP2 include an up signal that generates pulses during an upward movement of the bracket 21 (or the light sensor 24), and a down signal that generates pulses during a downward movement of the bracket 21. The two up-down counters 48 and 58 count up and down the number of pulses included in the up signal and down signal. The counts on the up-down counters 48 and 58 accordingly represent the vertical positions of the light sensor 24.

The two up-down counters 48 and 58 are enabled by the starting position signal SREF generated by the timing sensor 32 to start operation. At the same time, the counts on the two counters 48 and 58 are cleared to zero. The starting position signal SREF for each cassette is set in a wired OR condition. An On-state of the starting position signal SREF for any cassette accordingly starts the operation of the up-down counters 48 and 58.

The CPU 42 monitors the count on the first up-down counter 48 and determines whether or not the bracket 21 has been lifted up to its upper-most position. When the count on the up-down counter 48 reaches a predetermined upper limit, the CPU 42 determines that the bracket 21 has already moved up to its upper-most position, stops its upward movement, and reversely starts the downward movement of the bracket 21.

The anti-chattering circuit 54 generates a timing signal ST showing that the light-receiving signal SL has changed its level. In practice, the anti-chattering circuit 54 generates one pulse of timing signal ST when the second positional pulse signal SP2 continuously generates a predetermined number of pulses, for example, 5 pulses, after the change of level of the light-receiving signal SL. This structure effectively prevents chattering of the timing signal ST even when chattering occurs in the light-receiving signal SL.

Figure 5:
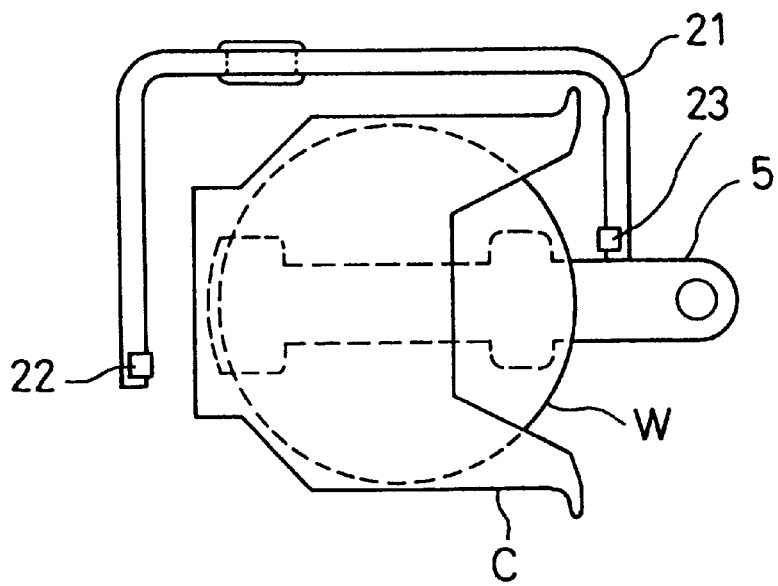
FIGS. 5A and 5B show the structure of a substrate loading and unloading mechanism 4.
Figure 5:
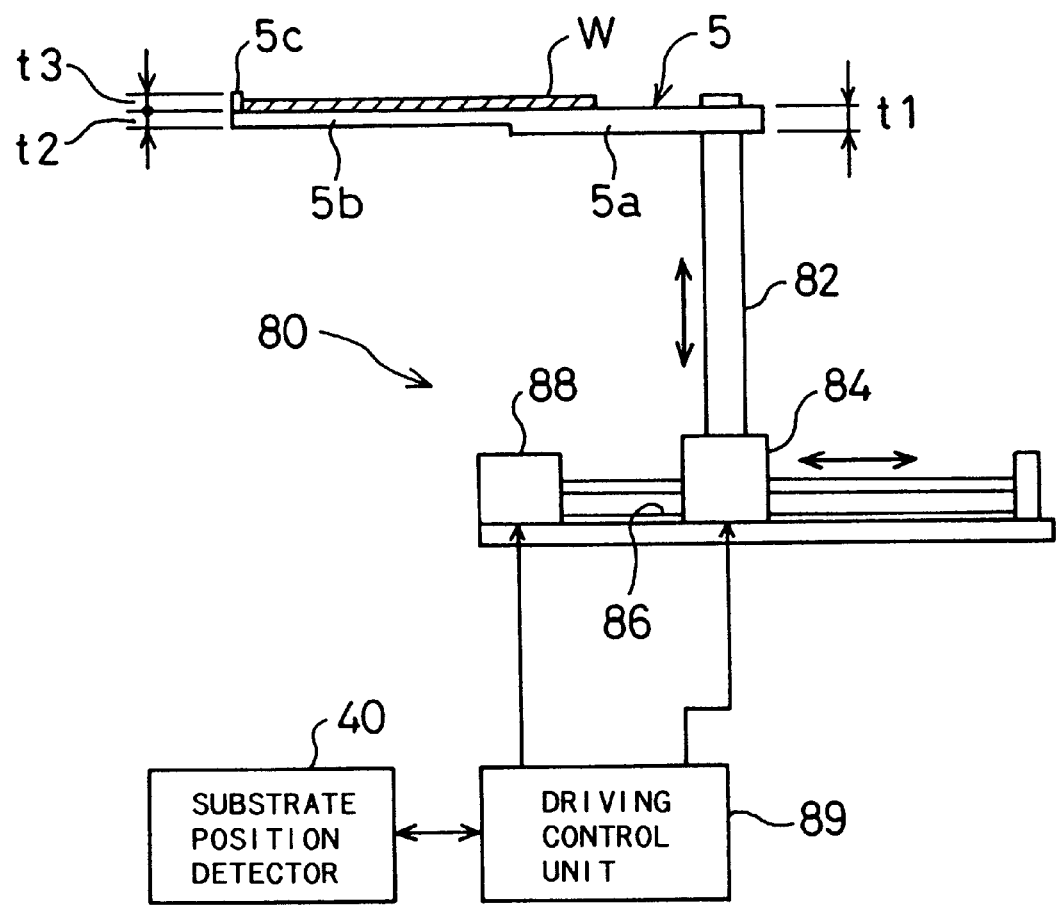

A count CNT on the second up-down counter 58 is latched in response to the timing signal ST generated by the anti-chattering circuit 54, and is then written into the FIFO memory 46. The counts CNT measured at the respective time points when the level of the light-receiving signal SL is switched are successively stored into the FIFO memory 46. B. Structure of Cassette C and Substrate Conveyance Arm 5 and Procedure of Detecting Position of wafer FIGS. 5A and 5B show the structure of the substrate loading and unloading mechanism 4. FIG. 5A is a plan view illustrating the state in which the substrate conveyance arm 5 supporting the wafer W is inserted in the cassette C, and FIG. 5B is a side view thereof. In FIG. 5B, a mechanism for driving the substrate conveyance arm 5 is shown while the cassette C and the bracket 21 are omitted.

Referring to FIG. 5B, the substrate conveyance arm 5 is a plate-like member and includes a thick-plate portion 5a at its rear end, a thin-plate portion 5b at its center, and a protrusion portion 5c formed on a free end of the thin-plate portion 5b. The thick-plate portion 5a has a thickness t1 of, for example, approximately 1.5 mm; the thin-plate portion 5b has a thickness t2 of approximately 1.0 mm; and the protrusion portion 5c has a thickness t3 of approximately 1.0 mm.

An arm driving mechanism 80 for driving the substrate conveyance arm 5 is arranged in the vicinity of the rear end of the thick-plate portion 5a. The arm driving mechanism 80 includes a vertical shaft 82 linked with the substrate conveyance arm 5, a vertical driving unit 84 for moving up and down the vertical shaft 82, a horizontal guide 86 for guiding the vertical driving unit 84 in the horizontal direction, a horizontal driving unit 88 for moving the vertical driving unit 84 in the horizontal direction along the horizontal guide 86, and a driving control unit 89 for controlling the vertical driving unit 84 and the horizontal driving unit 88. The driving control unit 89 is electrically connected with the substrate position detector 40.

Figure 6A:
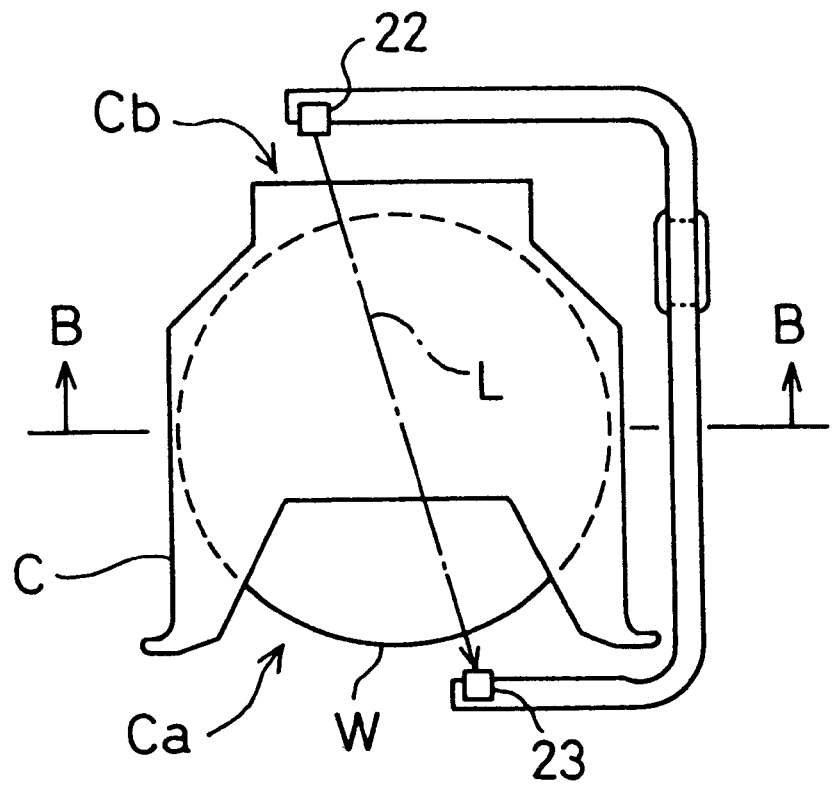
FIGS. 6A and 6B show the structure of a cassette C.
Figure 6B:
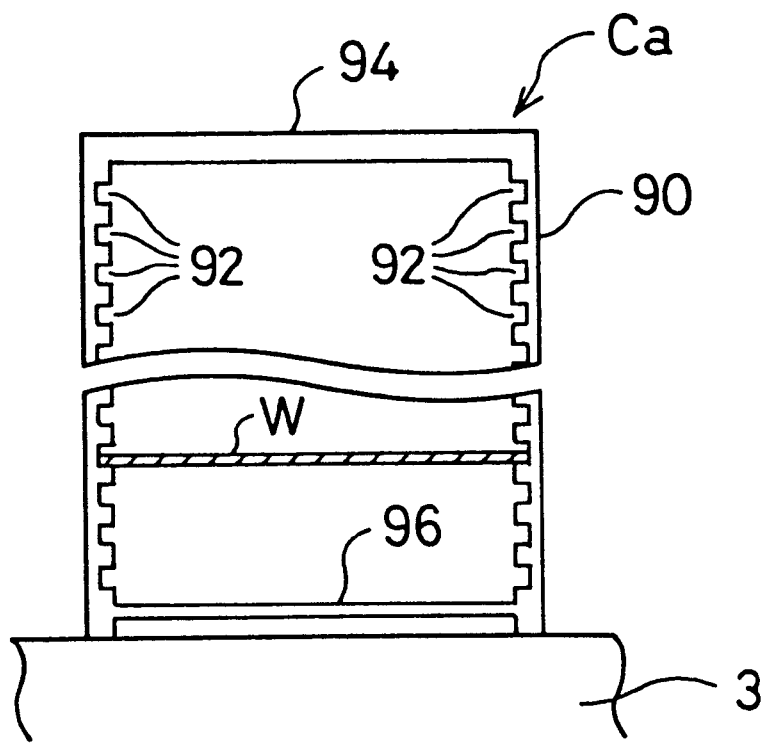

FIG. 6A is a plan view illustrating the structure of the cassette C, and FIG. 6B is a cross sectional view, taken along the line B—B of FIG. 6A. For the clarity of illustration, structural lines close to the rear-end opening Cb of the cassette C are omitted from the drawing of FIG. 6B. A number of grooves 92 are formed inside a side wall plate 90 of the cassette C, and wafers W are accommodated in these grooves 92. The cassette C further includes a top plate 94 on its upper end and a structural member 96 referred to as an H-bar in the vicinity of its lower end. The name of the H-bar 96 is derived from a substantially H-shaped cross section thereof.

Referring to FIG. 6A, the light beam L emitted from the light emission element 22 enters the cassette C through the rear-end opening Cb of the cassette C, passes through the substrate insertion opening Ca, and is received by the light receiving element 23. While the light sensor 24 (that is, the light emission element 22 and the light receiving element 23) is moving in the vertical direction along the periphery of the cassette C mounted on the cassette table 3 as shown in FIG. 6B, the light beam L emitted from the light emission element 22 is blocked by the cassette table 3, the H-bar 96 in the cassette C, the wafer W within the cassette C, and the top plate 94 of the cassette C.

FIGS. 7A and 7B show a wave form of the light-receiving signal SL generated by the light receiving element 23 as the light sensor 24 moves up. FIG. 7B schematically illustrates the structure corresponding to FIG. 6B, and FIG. 7A shows the wave form of the corresponding light-receiving signal SL. In this embodiment, it is assumed that twenty five wafers W can be accommodated in each cassette C and that several wafers are actually held in the cassette C as shown in FIG. 7A. When the light receiving element 23 is in a light-receiving state, the light-receiving signal SL is in level 0 (or low level "L"). When the light receiving element 23 is in a non-light receiving state (or shielding state), on the other hand, the light-receiving signal SL is in level 1 (or high level "H").

FIGS. 8 (a)–8 (d) are timing charts showing the operation of the substrate position detector 40 shown in FIG. 4. FIGS. 8(a)–8 (d) show: the second positional pulse signal SP2 generated by the PLL circuit 60; the starting position signal SREF generated by the timing sensor 32; the light-receiving signal SL generated by the light receiving element 23; and the count CNT stored in the FIFO memory 46.

When the light sensor 24 starts moving up and the starting position signal SREF generated by the timing sensor 32 is changed to the high level, the substrate position detector 40 starts its operation. At this moment, the counts on the up-down counters 48 and 58 are initialized to zero. As shown in FIG. 8(a), the positional pulse signal SP2 generates one pulse every time when the light sensor 24 moves by a predetermined distance (for example, 0.025 mm). The up-down counters 48 and 58 counts up the number of pulses of the positional pulse signal SP2. In this embodiment, it is assumed that the light sensor 24 moves up at a constant speed. The positional pulse signal SP2 shown in FIG. 8(a) is accordingly an up signal, whereas the down signal generates no pulses.

When the light-receiving signal SL (FIG. 8(c)) generated by the light receiving element 23 changes its level, the count CNT on the second up-down counter 58 is held by the latch 56 to be stored into the FIFO memory 46 as shown in FIG. 8 (d). The counts CNT measured at respective time points T1, T2, ... T7, when the level of the light-receiving signal SL is switched, are successively stored into the FIFO memory 46.

The count CNT represents a vertical distance from the starting position defined by the timing sensor 32. The vertical positions of the light sensor 24 at the respective time points T1, T2, ... T7 can thus be calculated from the counts CNT stored in the FIFO memory 46. The positions of the H-bar 96 and the top plate 94 of the cassette C are known in advance. The CPU 42 accordingly determines a vertical positional range of each wafer W held in the cassette C, based on the count CNT stored in the FIFO memory 46. Simultaneously with the determination of the vertical positional range of each wafer W, a clearance between each pair of the wafers W is also determined.

The substrate position detector 40 of the embodiment corresponds to the substrate position detecting means and the clearance measuring means of the present invention. The CPU 42 implements the function corresponding to the position determining means of the present invention. Computer program codes realizing the function of the position determining means (applications programs) may be stored in a portable storage medium, such as floppy disks and CD-ROMS, and transferred from the portable storage medium to the main memory 44 or an external storage device (not shown). The computer program codes are stored in the main memory 44 when being executed.

As discussed previously, in practice, the anti-chattering circuit 54 shown in FIG. 4 generates one pulse of timing signal ST when the positional pulse signal SP2 continuously generates a predetermined number of pulses (for example, 5 pulses) after the level change of the light-receiving signal SL. This means that the timing at which the latch 56 takes in the count CNT is delayed by five pulses. The position determined by subtracting a value corresponding to five pulses from the position calculated from the count CNT stored in the FIFO memory 46 represents an accurate position.

Referring back to FIG. 7B, as for the wafers W held in a substantially horizontal state, a time period for which the light-receiving signal SL is in the level 1 (level "H") practically corresponds to the actual thickness of the wafer W. As for the wafers W held in an inclined state, on the other hand, the time period for which the light-receiving signal SL is in level 1 (level "H") corresponds to the projection of the wafer W projected by a light beam in the horizontal direction. The projection is significantly greater than the actual thickness of the wafer W. The structure of the embodiment determines the vertical positional range of each wafer W as well as the clearance between the wafers W even when the wafers W are held in an inclined state. In this embodiment, the substrate conveyance arm 5 is moved in a course which is suitable for the clearance between the wafers W, so as to prevent collision of the substrate conveyance arm 5 against the wafers W as discussed below.

FIGS. 9A–9D show an operation mode of the substrate conveyance arm 5 according to the value of the clearance between the wafers W. In the examples of FIGS. 9A–9D, a standard pitch for the wafers held in the cassette C is 6.35 mm, and an upper wafer W1 among two wafers W1 and W2 is taken out of the cassette C.

Figure 9A:
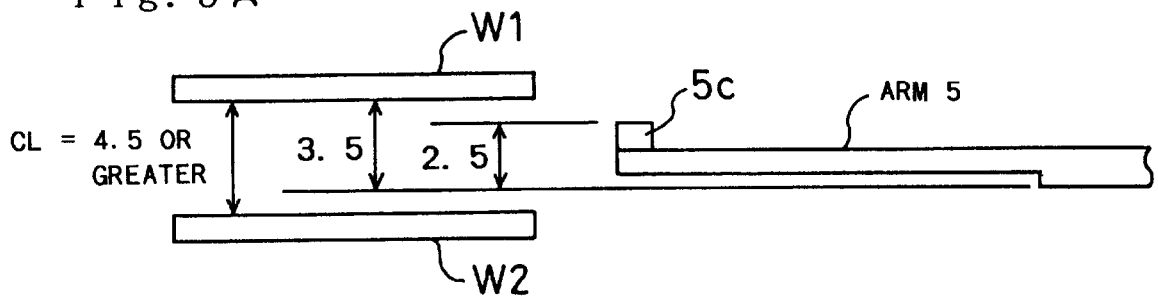
FIGS. 9A–9D show an operation mode of a substrate conveyance arm 5 according to a clearance between wafers.

Referring to FIG. 9A, when a clearance CL between the two wafers W1 and W2 is equal to or greater than 4.5 mm, the bottom surface of the substrate conveyance arm 5 is set at a height that is 3.5 mm below the lower end of the upper wafer W1. While being kept at the height, the substrate conveyance arm 5 is moved horizontally and inserted between the wafers W1 and W2. Since the maximum thickness of the substrate conveyance arm 5 is 2.5 mm, the insertion still leaves a clearance of no less than 1 mm between the upper end of the substrate conveyance arm 5 (that is, the upper end of the protrusion portion 5c) and the bottom end of the upper wafer W1. There is also a clearance of no less than 1 mm between the bottom surface of the substrate conveyance arm 5 and the upper end of the lower wafer W2. The horizontal insertion of the substrate conveyance arm 5 accordingly does not cause the interference of the substrate conveyance arm 5 with the wafers W1 and W2.

Figure 9B:
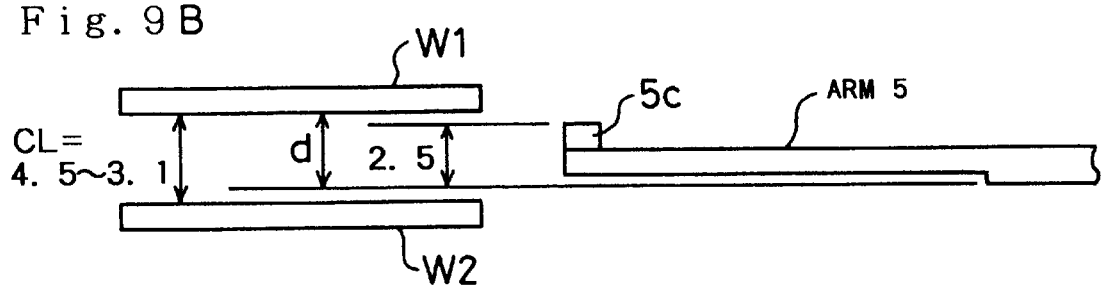

In case that the clearance CL between the two wafers W1 and W2 is not less than 3.1 mm but less than 4.5 mm as shown in FIG. 9B, the bottom surface of the substrate conveyance arm 5 is set lower than the lower end of the upper wafer W1 by a distance d given by the following equation:

$$d=3.5-(4.5-CL)/2 \quad [mm]$$

When the height of the arm 5 is determined using the distance d given by the above equation, the bottom surface of the substrate conveyance arm 5 is set at a position higher than the position of FIG. 9A by half the difference between 4.5 mm and the clearance CL of FIG. 9B. In this state, a clearance can be ensured between the substrate conveyance arm 5 and each wafer. The horizontal insertion of the substrate conveyance arm 5 accordingly does not cause the interference of the substrate conveyance arm 5 with the wafers W1 and W2.

Figure 9C:
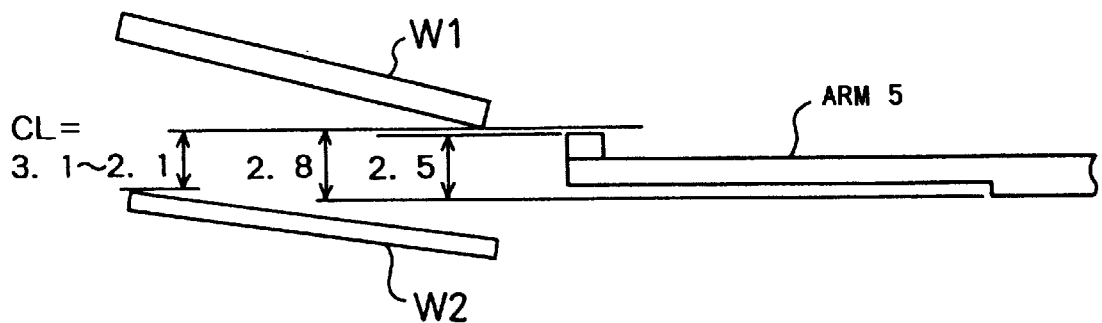

In case that the clearance CL between the two wafers W1 and W2 is not less than 2.1 mm but less than 3.1 mm as shown in FIG. 9C, it is thought that both the wafers W1 and W2 are inclined forward. In this case, the bottom surface of the substrate conveyance arm 5 is set at a position that is 2.8 mm below the lower end of the upper wafer W1. The substrate conveyance arm 5 starts a horizontal insertion at this height and is further inserted while moving up by 0.8 mm at the position below the upper wafer W1.

Figure 10A:
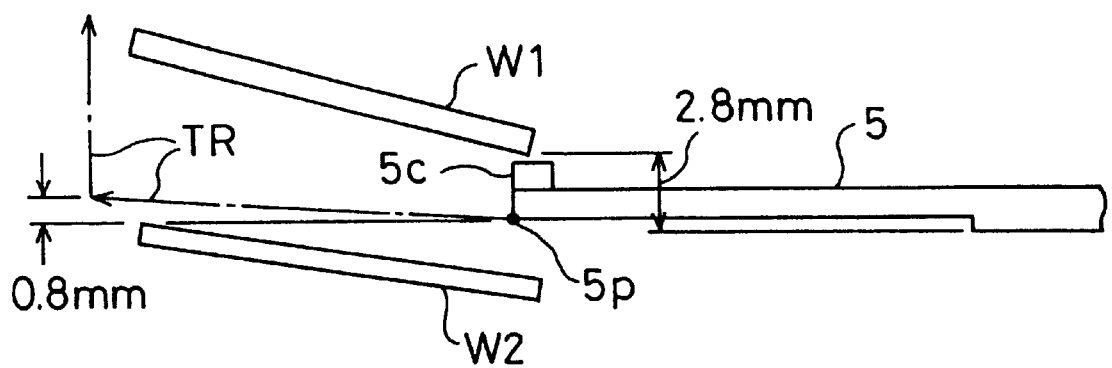
FIGS. 10A and 10B show a locus when the substrate conveyance arm is inserted in a slant direction.
Figure 10B:
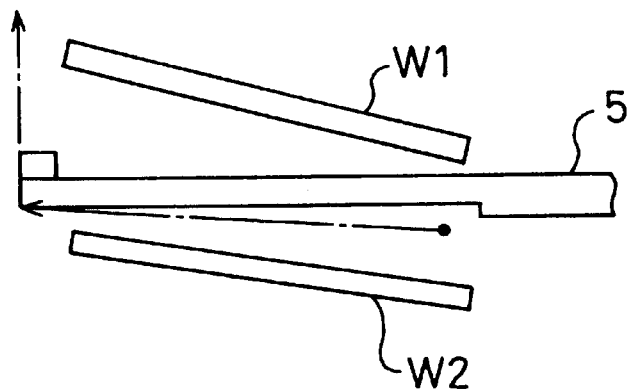

FIGS. 10A and 10B show a locus of the substrate conveyance arm 5 in the case of FIG. 9C. As shown in FIG. 10A, the substrate conveyance arm 5 is inserted in the horizontal direction, while the bottom surface of the substrate conveyance arm 5 is kept at a height that is 2.8 mm below the lower end of the upper wafer W1. When the protrusion portion 5c reaches the position immediately below the front end (the right-hand end in FIG. 10) of the wafer W1, the substrate conveyance arm 5 is moved linearly in a slant direction along a locus TR shown by the one-dot chain line. The locus TR represents a course of a corner 5p of the substrate conveyance arm 5. FIG. 10B shows the state after the substrate conveyance arm 5 has been further shifted to the end of the locus in the slant direction. The substrate conveyance arm 5 is lifted up by 0.8 mm from the position of FIG. 10A to the position of FIG. 10B so that the bottom surface of the substrate conveyance arm 5 does not come into contact with the upper end of the lower wafer W2. The substrate conveyance arm 5 moves up in the vertical direction from the position of FIG. 10B to receive the upper wafer W1. The driving control unit 89 shown in FIG. 5B controls the vertical driving unit 84 and the horizontal driving unit 88 to attain the operation of the substrate conveyance arm 5 shown in FIGS. 10A and 10B.

Referring back to FIG. 9D, if the clearance CL between the two wafers W1 and W2 is not less than 1.0 mm but less than 2.1 mm, the bottom surface of the substrate conveyance arm 5 is set at a height that is 2.8 mm below the lower end of the upper wafer W1. This state is the same as that in the case of FIG. 9C. The substrate conveyance arm 5 starts an insertion at this height and is further inserted while moving up by 1.5 mm at the position below the upper wafer W1. This locus is substantially identical with that shown in FIGS. 10A and 10B except the vertical moving distance on the locus in the slant direction (that is, the width of the upward movement).

In case that the clearance CL between the two wafers W1 and W2 is less than 1.0 mm, it is difficult to insert the substrate conveyance arm 5 without interfering with the wafers W1 and W2. In this case, the substrate position detector 40 gives an alarm (alarm sound or alarm display) to inform the operator of the difficulty in insertion, whereas the driving control unit 89 stops the substrate conveyance arm 5. When the clearance CL is less than a predetermined limit value (for example, 1.0 mm), the apparatus of the embodiment stops the further movement of the substrate conveyance arm 5 and gives an alarm. This effectively prevents the substrate conveyance arm 5 from being forcibly inserted and damaging the wafers W1 and W2.

Figure 9D:
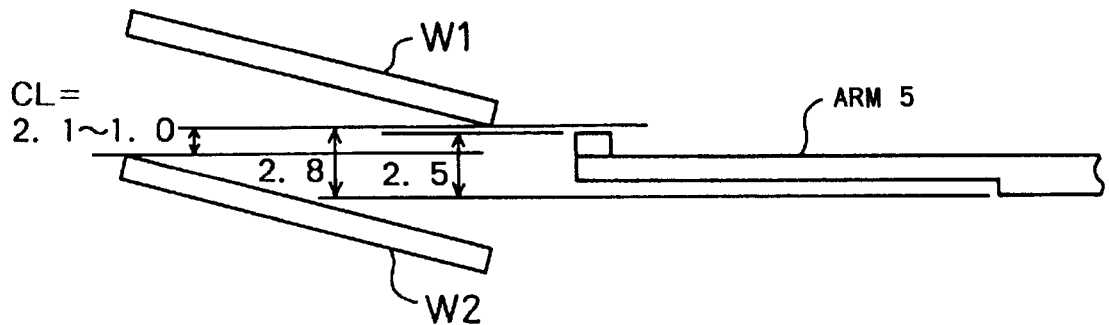

As discussed above, in the apparatus of the embodiment, the driving control unit 89 changes the locus of insertion of the substrate conveyance arm 5 according to the clearance CL between the two wafers W1 and W2 measured along the direction of insertion of the substrate conveyance arm 5. This feature effectively prevents the free end of the substrate conveyance arm 5 from colliding with the two wafers W1 and W2 while preventing the bottom surface of the substrate conveyance arm 5 from coming into contact with the upper surface of the lower wafer W2. As shown in FIGS. 9A and 9B, if the clearance CL is equal to or greater than a predetermined critical value (3.1 mm), which is obtained by adding a preset allowance (0.6 mm) to the maximum thickness (2.5 mm) of the substrate conveyance arm 5, the substrate conveyance arm 5 is inserted in the horizontal direction. As shown in FIGS. 9C and 9D, if the clearance CL is not less than a predetermined limit value (1.0 mm) but less than the predetermined critical is value, the substrate conveyance arm 5 is inserted horizontally until the free end portion of the substrate conveyance arm 5 reaches at the position immediately below the front ends of the wafers W1 and W2. The substrate conveyance arm 5 is then further inserted while moving up along the locus TR in a slant direction. The vertical moving distance on the locus TR in the slant direction is determined according to the value of the clearance CL, so as to prevent the bottom surface of the substrate conveyance arm 5 from coming into contact with the upper surface of the lower wafer W2. Since the thickness of the free end portion of the substrate conveyance arm 5 is generally smaller than the maximum thickness of the substrate conveyance arm 5, insertion of the substrate conveyance arm 5 along the locus TR in the slant direction can prevent the substrate conveyance arm 5 from interfering with the two wafers W1 and W2.

The critical value and the limit value specified above are only examples and are determined appropriately according to: the pitch of wafers within the cassette C; the thickness of the substrate conveyance arm 5; and the like.

The wafer W1 taken out of the cassette C is processed successively by the group of processing units 2 and returned into the same cassette C after completion of the processing. The driving control unit 89 of the substrate conveyance arm 5 (see FIGS. 5A and 5B) returns the wafer W1 to the cassette C inversely following the locus TR, which has been taken at the time of taking out the wafer W1. This feature effectively prevents the substrate conveyance arm 5 from interfering with the lower wafer W2 when the wafer W1 is returned into the cassette C. The conditions of each wafer in the cassette C (including the clearance CL) are stored in the main memory 44 of the substrate position detector 40 (see FIG. 4), and the driving control unit 89 carries out the above control procedure based on such conditions.

The present invention is not restricted to the above embodiment, but there may be many modifications, changes, and alterations without departing from the scope and spirit of the main characteristics of the invention, such as follows:

(1) Although the light sensor 24 moves up and down in the above embodiment, the cassette C may moved up and down instead of the light sensor 24. Namely, at least either one of the light sensor 24 and the cassette C is moved in the vertical direction relative to each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for conveying a substrate from and into a cassette with a conveyance arm, said apparatus comprising:

clearance measurement means for measuring a vertical clearance between a pair of substrates held in said cassette; and arm driving means for inserting said conveyance arm between said pair of substrates while lifting up said conveyance arm along a slant locus when said vertical clearance is less than a predetermined critical value.

2. An apparatus in accordance with claim 1, wherein said arm driving means comprises means for adjusting an amount of the lift in said slant locus as a function of said vertical clearance.

3. An apparatus in accordance with claim 1, wherein said arm driving means horizontally inserts said conveyance arm between said pair of substrates when said vertical clearance is more than said predetermined critical value.

4. An apparatus in accordance with claim 1, further including:

means for stopping the insertion of said conveyance arm and raising an alarm if said vertical clearance is less than a predetermined limit value.

5. An apparatus in accordance with claim 1, wherein said clearance measurement means comprises clearance storing means for storing said vertical clearance; and wherein said arm driving means drives said conveyance arm when returning a substrate which was taken out from said cassette so that said conveyance arm is inserted into said cassette along said slant locus.

6. An apparatus in accordance with claim 1, wherein said clearance measurement means includes:

a light sensor unit having a light-emission element and a light-receiving element arranged to face each other across said cassette;

vertical driving means for moving at least one of said light sensor unit and said cassette relative to each other in a vertical direction; and clearance detecting means for detecting said vertical clearance, based on a wave form of an output signal generated by said light sensor unit as said at least one of said light sensor unit and said cassette is vertically moving relative to each other.

7. An apparatus in accordance with claim 6, wherein said cassette includes a first opening through which each substrate is inserted and taken out and a second opening arranged opposite to said first opening; and wherein said light-emission element and said light-receiving element are arranged so that a light beam emitted from said light-emission element is to pass through said first opening and said second opening to be received by said light-receiving element.

8. An apparatus in accordance with claim 7, wherein said light-emission element and said light-receiving element are substantially horizontally arranged.

9. An apparatus in accordance with claim 6, wherein said clearance detecting means includes position determining means for determining a range of an output level of said light sensor unit that represents a non-light receiving state of said light-receiving element as said vertical clearance.

10. An apparatus in accordance with claim 6, wherein said clearance detecting means includes:

positional pulse signal generating means for generating one pulse of a positional pulse signal each time when said at least one of said light sensor unit and said cassette vertically moves by a predetermined distance relative to each other;

a counter for counting the number of pulses of said positional pulse signal;

storage means for successively storing the count on said counter when an output level of said light sensor unit is changed; and position determining means for determining said vertical clearance based on the count stored in said storage means.

11. A method of conveying a substrate from and into a cassette with a conveyance arm, said method comprising the steps of:

measuring a vertical clearance between a pair of substrates held in said cassette; and inserting said conveyance arm between said pair of substrates while lifting up said conveyance arm along a slant locus when said vertical clearance is less than a predetermined critical value.

12. An apparatus for conveying a substrate from and into a cassette with a conveyance arm, said apparatus comprising:

a clearance measurement device to measure a vertical clearance between a pair of substrates held in said cassette; and an arm driving device to insert said conveyance arm between said pair of substrates while lifting up said conveyance arm along a slant locus when said vertical clearance is less than a predetermined critical value.

13. An apparatus in accordance with claim 12, wherein said arm driving device includes an adjusting device to adjust an amount of the lift in said slant locus as a function of said vertical clearance.

14. An apparatus in accordance with claim 12, wherein said arm driving device horizontally inserts said conveyance arm between said pair of substrates when said vertical clearance is more than said predetermined critical value.

15. An apparatus in accordance with claim 12, further including:

a stopping device to stop the insertion of said conveyance arm and raising an alarm if said vertical clearance is less than a predetermined limit value.

16. An apparatus in accordance with claim 12, wherein said clearance measurement device includes a clearance storing device for storing said vertical clearance; and wherein said arm driving device drives said conveyance arm when returning a substrate which was taken out from said cassette so that said conveyance arm is inserted into said cassette along said slant locus.

17. An apparatus in accordance with claim 12, wherein said clearance measurement device includes:

a light sensor unit having a light-emission element and a light-receiving element arranged to face each other across said cassette;

a vertical driving device to move at least one of said light sensor unit and said cassette relative to each other in a vertical direction; and a clearance detector to detect said vertical clearance, based on a wave form of an output signal generated by said light sensor unit as said at least one of said light sensor unit and said cassette is vertically moving relative to each other.

18. An apparatus in accordance with claim 17, wherein said cassette includes a first opening through which each substrate is inserted and taken out and a second opening arranged opposite to said first opening; and wherein said light-emission element and said light-receiving element are arranged so that a light beam emitted from said light-emission element is to pass through said first opening and said second opening to be received by said light-receiving element.

19. An apparatus in accordance with claim 18, wherein said light-emission element and said light-receiving element are substantially horizontally arranged.

20. An apparatus in accordance with claim 17, wherein said clearance detector includes a position determining device to determine a range of an output level of said light sensor unit that represents a non-light receiving state of said light-receiving element as said vertical clearance.

21. An apparatus in accordance with claim 17, wherein said clearance detector includes:

a positional pulse signal generator to generate one pulse of positional pulse signal each time when said at least one of said light sensor unit and said cassette vertically moves by a predetermined distance relative to each other;

a counter to count the number of pulses of said positional pulse signal;

a storage device to successively store the count on said counter when an output level of said light sensor unit is changed; and a position determining device to determine said vertical clearance based on the count stored in said storage device.

* * * * *